United States Patent [19]

Pulyer

[11] Patent Number: 5,389,879
[45] Date of Patent: Feb. 14, 1995

[54] MRI DEVICE HAVING HIGH FIELD STRENGTH CYLINDRICAL MAGNET WITH TWO AXIALLY SPACED ELECTROMAGNETS

[76] Inventor: Yuly M. Pulyer, 350 Revere Beach Blvd., Revere, Mass. 02151

[21] Appl. No.: 993,313

[22] Filed: Dec. 18, 1992

[51] Int. Cl.$^6$ .............................................. G01R 33/28
[52] U.S. Cl. ................................. 324/318; 324/320
[58] Field of Search ............... 324/318, 322, 319, 320; 335/296, 301, 299, 282

[56] References Cited

U.S. PATENT DOCUMENTS

| | | | |
|---|---|---|---|
| 3,187,237 | 6/1965 | Craig et al. | 335/301 |
| 3,434,085 | 3/1969 | Gang | 335/301 |
| 3,437,963 | 4/1969 | Gang et al. | 335/301 |
| 3,460,083 | 8/1969 | Johnson | 335/301 |
| 3,898,599 | 8/1975 | Reid et al. | 335/302 |
| 4,095,202 | 6/1978 | Danielsson et al. | 335/299 |
| 4,580,120 | 4/1986 | Jacquot | 335/214 |
| 4,608,991 | 9/1986 | Rollwitz | 128/653 |
| 4,644,313 | 2/1987 | Miyajima | 324/318 |
| 4,679,022 | 7/1987 | Miyamoto et al. | 335/296 |
| 4,701,736 | 10/1987 | McDougall et al. | 335/299 |
| 4,723,116 | 2/1988 | Muller et al. | 324/320 |
| 4,748,414 | 5/1988 | Knuttel et al. | 324/318 |
| 4,812,797 | 3/1989 | Jayakumar | 335/299 |
| 4,818,966 | 4/1989 | Miyamoto et al. | 335/304 |
| 4,978,920 | 12/1990 | Mansfield et al. | 324/318 |
| 5,008,624 | 4/1991 | Yoshida | 324/318 |
| 5,012,217 | 4/1991 | Palkovich et al. | 324/318 |
| 5,049,484 | 9/1991 | Pulyer | 335/296 |
| 5,138,326 | 8/1992 | Edwards | 324/319 |

FOREIGN PATENT DOCUMENTS

PCT/GB890-1296  10/1989  WIPO .

Primary Examiner—Kenneth A. Wieder
Assistant Examiner—Raymond Y. Mah
Attorney, Agent, or Firm—George W. Neuner

[57] ABSTRACT

An MRI imaging device has a cylindrical magnet configuration, gradient coils and an Rf coil. The magnet has a primary and a secondary electromagnet on the same longitudinal center axis but spaced apart along the axis. Each electromagnet is a coil located within a flux guiding member preferably having a cylindrical structure closed at one end. The electromagnets provide a static magnetic field having substantial homogeneity in a central air gap $A_G$ extending from within the primary electromagnet coil axially beyond the primary coil toward the secondary electromagnet coil.

2 Claims, 4 Drawing Sheets

MRI DEVICE HAVING HIGH FIELD STRENGTH CYLINDRICAL MAGNET WITH TWO AXIALLY SPACED ELECTROMAGNETS

FIELD OF THE INVENTION

This invention relates to a Magnetic Resonance Imaging (MRI) device and to a magnet design using two axially spaced electromagnets having a substantially homogeneous field extending beyond the end of the primary electomagnet. The MRI device is particularly useful for MRI mammography.

BACKGROUND OF THE INVENTION

There are known whole body MRI systems (superconductive, permanent magnets and resistive magnets), having field homogeneity in the air gap, i.e. imaging volume, in the center of the magnet and, therefore, any part of the body has to be placed in the center of the magnet to be imaged.

However, the whole body magnets are generally very expensive to purchase and maintain and, therefore, they are not widely available for the substantial need to provide a regular and frequent imaging like mammography as well as imaging of other organs. Prior art electro-magnets such as described by Watson et al and Miller et al. and other prior art iron core magnets have a substantial edge fringe field effect, which makes it hard to image beginning immediately at the magnet edge or even proximal to the edge of the magnet due to lack of sufficient field homogeneity. In addition, those types of the prior art magnets, of the iron core electro- or permanent type, typically have a structural design to provide a high strength magnetic field at a large central air gap.

In U.S. Pat. No. 5,049,848 a magnet configuration for MRI mammography is disclosed. The magnetic structure 50 has a rectangular shaped magnet with at least two parallel magnetic sources 5,6 connected by a ferromagnetic core flux path defining an air gap for imaging. A remote shimming C-shaped magnetic source is preferably used to decrease the front edge fringe effect of the magnetic structure 50 to create a relatively homogeneous field in the air gap beginning at the front edge for effective imaging.

However, a relatively small and economical MRI device for mammography is still being sought. Thus, additional magnet configurations capable of providing field homogeneity at the front edge of the magnet are desired.

SUMMARY OF THE INVENTION

The present invention provides an MRI imaging device comprising a cylindrical magnet configuration, gradient coils and an Rf coil. The magnet comprises a primary and a secondary electromagnet having the same longitudinal center axis but spaced apart along the axis. Each electromagnet comprises a coil located within a flux guiding member preferably comprising a cylindrical structure closed at one end. The electromagnets provide a static magnetic field having substantial homogeneity in a central air gap $A_G$ extending from within the primary electromagnet axially beyond the primary electromagnet toward the secondary electromagnet.

Gradient coils are provided for producing a gradient magnetic field in X, Y and Z directions and a transceiver coil is preferably provided for producing Rf pulses and receiving NMR signals, both in a manner well known to those skilled in the art.

The basic magnet configuration of the present invention uses electromagnets to generate flux to provide the static magnetic field in the air gap. The electromagnets may be superconductive. Equivalent permanent magnets may also be used in certain cases.

The present invention also provides a method for conducting mammography and for obtaining image data for medical diagnostic purposes. A method for performing mammography in accord with the invention comprises: providing an MRI imaging device comprising a cylindrical magnet having a primary electromagnet and a secondary electromagnet, the electromagnets having the same longitudinal axis and space apart along such axis, each electromagnet having associated therewith a flux guiding member that surrounds the cylindrical excitation coil except for end facing the other electromagnet; said magnet providing a static field; a gradient coil for providing a gradient magnetic field; and an Rf coil for providing an Rf field orthogonal to the static field; placing a female patient in the MRI imaging device so that the breast is adjacent the primary electromagnet and the secondary electromagnet is adjacent the back of the patient; and collecting imaging data.

DETAILED DESCRIPTION OF THE INVENTION

In accord with one embodiment of the present invention, a two part cylindrical magnet is provided for an MRI apparatus particularly useful for mammography.

Figure 1:
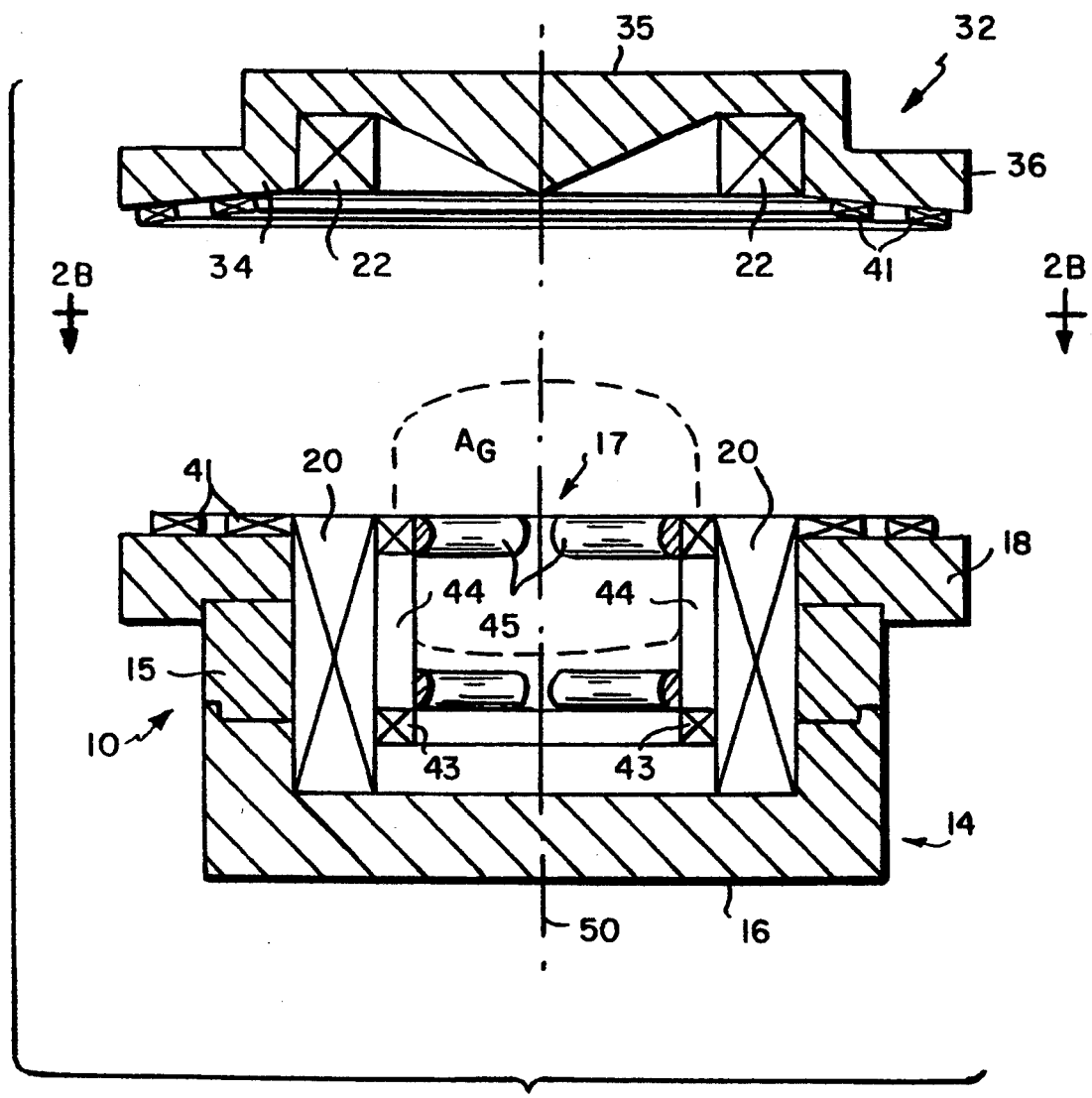
FIG. 1 is a front elevational view, in cross-section, illustrating one embodiment of a magnet in accord with the present invention.
Figure 2A:
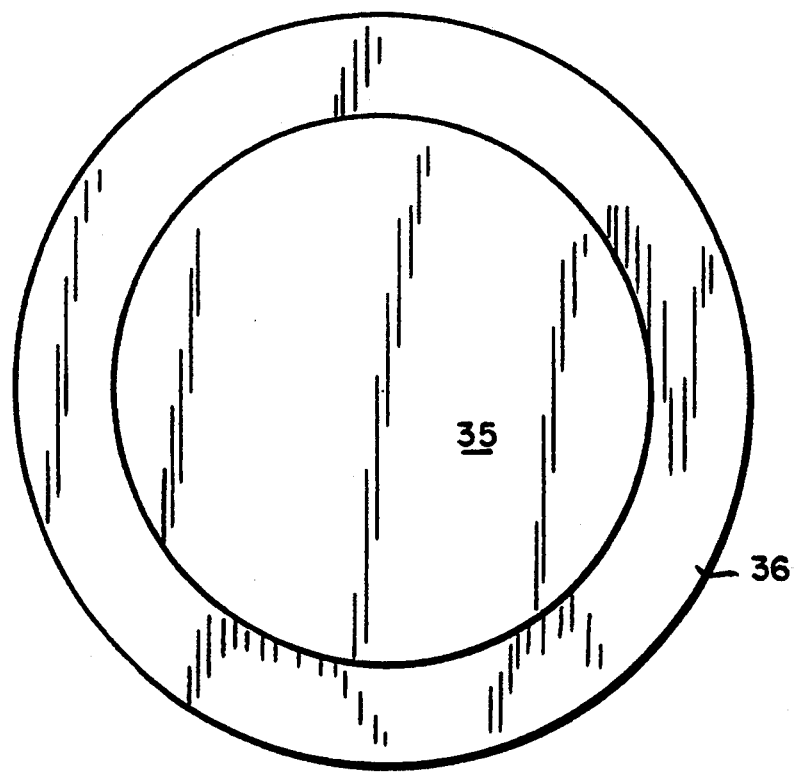
FIG. 2A is a top view of the magnet illustrated in FIG. 1.
Figure 2B:
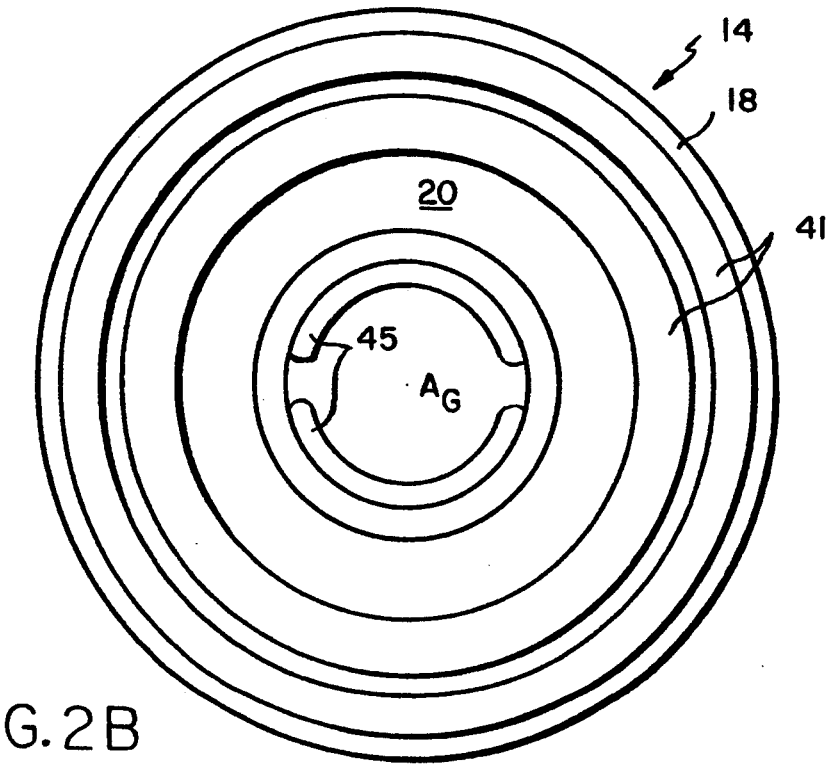
FIG. 2B is a view from 1—1 in FIG. 1.

Referring to the drawings, FIG. 1 illustrates a preferred embodiment of a magnet 10 in accord with the present invention. The magnet 10 is made of two cylindrical parts having the same central axis 50 but separated longitudinally along the axis. One part 14 contains a primary electromagnet coil 20 surrounded by a flux guiding member, i.e., cylinder 15 closed at one end 16 and open at the other end 17. The flux guiding member can be conveniently made from several parts as is illustrated in FIG. 1.

The other part 32 contains a secondary electromagnet coil 22 surrounded by a flux guiding member 34 also closed at one end 35.

The primary electromagnet coil 20 and secondary electromagnet coil 22 are operated to produce flux in the direction of the cylindrical axis and to establish a static field having a volume of substantial homogeneity in the air gap $A_G$ around the axis. The volume of homogeneity can be extended outside of the primary electromagnet axially toward the secondary electromagnet.

The flux guiding members 15, 16, 34, and 35, surrounding the electromagnet coils provide a return path for the flux and are preferably ferromagnetic.

In preferred embodiments, each of the flux guiding members have an annular component 18, 36 on which shimming coils 41 are positioned to control boundary conditions and facilitate the provision of a volume of substantial homogeneity in the air gap along the axis.

An MRI imaging device in accord with the invention also has gradient coils and a transceiver coil as is well known in the art.

Figure 3A:
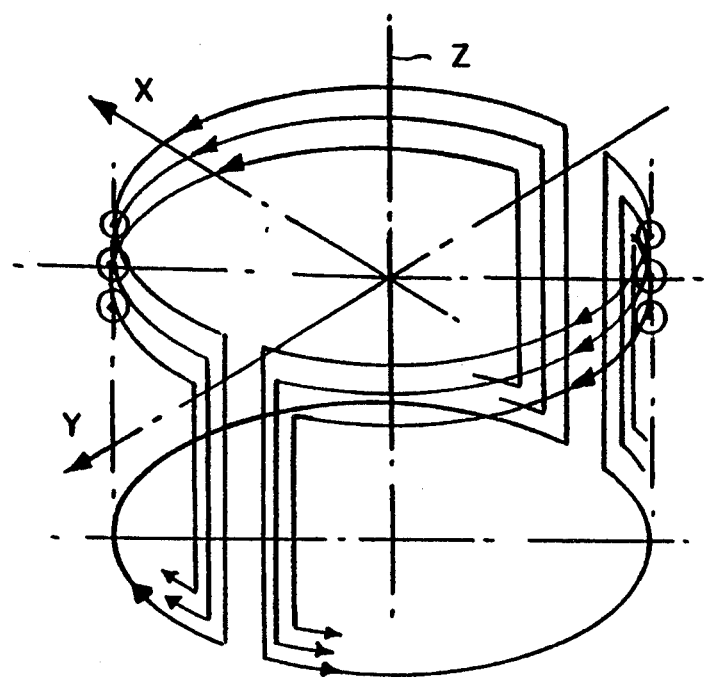
FIG. 3A is an illustration of a gradient coil useful in the practice of the present invention.
Figure 3B:
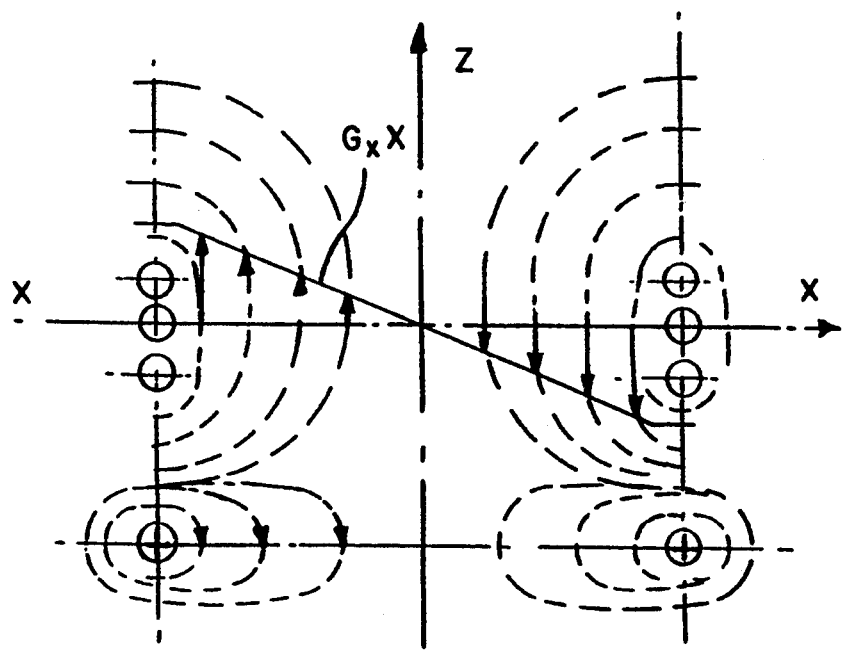
FIG. 3B is an illustration of the flux and field provided by the coil of FIG. 3A.

A gradient coil useful in the practice of the present invention for providing a gradient field in the X direction is illustrated in FIG. 3A. The coil configuration illustrated can provide a constant gradient field partially extending out of the coil volume to obtain a gradient field in a predetermined region of the field provided by such a coil is illustrated in FIG. 3B. A similar coil oriented at 90° to the X-gradient coil can be used to provide a gradient field in the Y direction. A Helmholtz coil can be used to provide a Z-gradient. Coils 43 and 44 in FIG. 1 illustrate gradient coils.

Figure 4A:
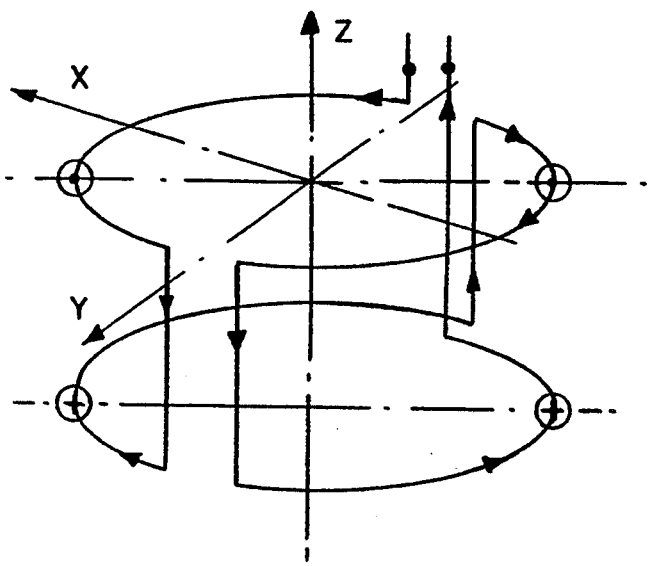
FIG. 4A is an illustration of an Rf coil useful in the practice of the present invention.
Figure 4B:
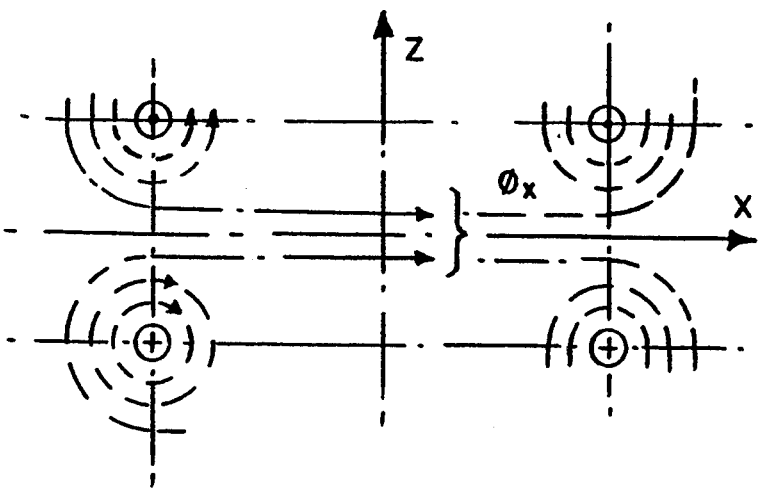
FIG. 4B is an illustration of the flux and field provided in the X-Z plane by the Rf coil of FIG. 4A.
Figure 4C:
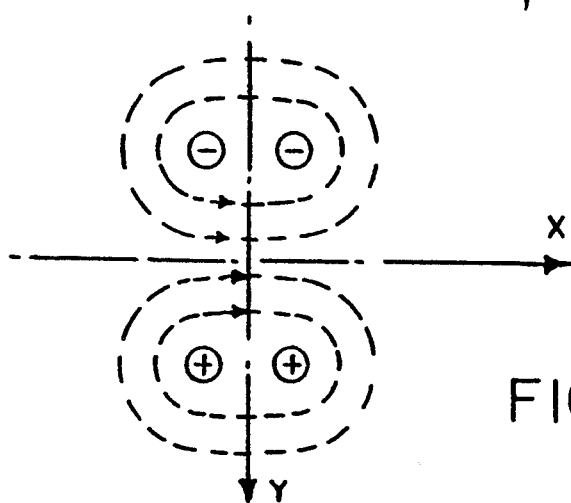
FIG. 4C is an illustration of the flux and field provided in the X-Y plane by the Rf coil of FIG. 4A.

A typical Rf coil for use in accord with the present invention is illustrated in FIG. 4A. The flux and field provided by such a coil are illustrated in FIGS. 4B and 4C. Conveniently, the Rf coil is used as a transceiver coil both to provide Rf pulses and to receive NMR signals. Coil 45 in FIG. 1 illustrates positioning of the Rf coil.

Provision and control of the gradient field and Rf pulses and the processing of NMR signals is accomplished in the conventional manner as is well known to those skilled in the art.

To obtain a mammogram, a female patient is positioned against the primary electromagnet 20 with the breast along the center line 50 and extending into the coil. The secondary electromagnet is positioned at the patient's back maintaining its center line in alignment with the primary coil. The Rf and gradient coils are operated in a predetermined sequence in a manner well known to those skilled in the art to obtain image data. The data is converted into an image, i.e. a mammogram, by well known techniques.

The present invention has been described in detail including the preferred embodiment thereof. However, it will be appreciated that modifications and improvements within the spirit and scope of the invention may be made by those skilled in the art upon consideration of the specification and drawings.

I claim:

1. An MRI imaging device comprising:
    a cylindrical magnet having a primary electromagnet and a secondary electromagnet, the electromagnets having the same longitudinal axis and spaced apart along such axis, each electromagnet having associated therewith a separate flux guiding member that substantially surrounds that electromagnet with an open end of that electromagnet facing the other electromagnet, the electromagnets providing a static magnetic field in a central air gap extending from within the primary electromagnet axially beyond the primary electromagnet toward the secondary electromagnet;
    a gradient coil for providing a gradient magnetic field in the central air gap; and
    an Rf coil for providing an Rf field orthogonal to the static field in the central air gap;
    wherein the flux guiding members comprise a cylinder closed at one end and having an annular surface at the other end, and wherein the magnet further comprises shimming coils located on said annular surface.

2. The MRI imaging device of claim 1, wherein the flux guiding members are ferromagnetic.

* * * * *